(12) United States Patent
Sanga et al.

(10) Patent No.: US 9,397,270 B2
(45) Date of Patent: Jul. 19, 2016

(54) SEMICONDUCTOR LIGHT EMITTING DEVICE AND METHOD OF MANUFACTURING THE SAME

(71) Applicant: Nichia Corporation, Anan-shi (JP)

(72) Inventors: Daisuke Sanga, Tokushima (JP); Yuta Oka, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/690,138

(22) Filed: Apr. 17, 2015

(65) Prior Publication Data

US 2015/0303356 A1    Oct. 22, 2015

(30) Foreign Application Priority Data

Apr. 18, 2014    (JP) .................................. 2014-086142

(51) Int. Cl.
| | |
|---|---|
| H01L 21/00 | (2006.01) |
| H01L 21/48 | (2006.01) |
| H01L 33/50 | (2010.01) |
| H01L 33/00 | (2010.01) |
| H01L 33/46 | (2010.01) |
| H01L 33/54 | (2010.01) |
| H01L 33/58 | (2010.01) |

(52) U.S. Cl.
CPC ............ *H01L 33/46* (2013.01); *H01L 33/0095* (2013.01); *H01L 33/54* (2013.01); *H01L 33/58* (2013.01); *H01L 2933/0033* (2013.01)

(58) Field of Classification Search
CPC ......... H01L 33/38; H01L 33/46; H01L 33/54; H01L 33/56; H01L 33/58; H01L 33/505; H01L 33/0095; H01L 2933/0033

USPC ............ 438/26, 27, 29, 113, 116; 257/13, 79, 257/98, E21.502, E33.059, E33.067, 257/E33.068, E33.072; 362/241, 247
See application file for complete search history.

(56) References Cited

U.S. PATENT DOCUMENTS

| | | | | |
|---|---|---|---|---|
| 7,134,775 | B2* | 11/2006 | Oishi ................... | F21S 48/1136 257/E25.02 |
| 7,338,823 | B2* | 3/2008 | Han ....................... | H01L 33/486 438/29 |
| 8,089,089 | B2* | 1/2012 | Kuo ....................... | H01L 21/561 257/98 |
| 8,669,575 | B2* | 3/2014 | Daicho ................. | F21S 48/145 257/13 |
| 2004/0042212 | A1* | 3/2004 | Du ........................... | F21S 8/02 362/292.04 |
| 2005/0167682 | A1* | 8/2005 | Fukasawa ............... | H01L 33/60 257/79 |

FOREIGN PATENT DOCUMENTS

| | | |
|---|---|---|
| JP | 2009-295611 A | 12/2009 |
| JP | 2011-171504 A | 9/2011 |
| WO | WO-2010/044240 A1 | 4/2010 |

* cited by examiner

Primary Examiner — Dao H Nguyen
(74) Attorney, Agent, or Firm — Foley & Lardner LLP

(57) ABSTRACT

A semiconductor light emitting device that achieves miniaturization and high brightness is provided. The semiconductor light emitting device has a light extraction surface (6) parallel to a lamination direction of a semiconductor layer (2). The semiconductor light emitting device includes a light guide member (3) placed on the semiconductor layer (2) and having a sloped surface (7) with a side surface opposite to the light extraction surface (6) sloped to the light extraction surface and a light-reflecting member (4) placed on a surface of the light guide member including at least the sloped surface of the light guide member.

4 Claims, 6 Drawing Sheets

SEMICONDUCTOR LIGHT EMITTING DEVICE AND METHOD OF MANUFACTURING THE SAME

BACKGROUND OF THE INVENTION

1. Field of the Invention

The present invention relates to a semiconductor light emitting device and a method of manufacturing the same.

2. Description of the Related Art

From the perspective of having high light emitting efficiency, low power consumption, and long life, light emitting diodes (hereinafter, abbreviated as "LEDs") are employed as a light source for various applied products, including lighting devices, such as optical communication devices and portable electronics. In white LEDs, which are considered as the current mainstream, white light only by a single LED element (single chip) is realized with a combination of a blue LED having a wavelength peak at around 450 nm and a yellow phosphor to convert the blue light to a wavelength around 550 nm.

In, for example, portable electronics and the like in recent years, miniaturization and high performance have been advanced significantly, and there is a demand for a more miniaturized and brighter semiconductor light emitting device that is capable of being mounted to such equipment. Miniaturized semiconductor light emitting devices are widespread as so-called chip size packages (CSPs). For example, Japanese Patent Publication No. 2009-295611A discloses a semiconductor light emitting element in which a sloped side surface is formed on a sapphire substrate to extract light from the side surface of the substrate.

SUMMARY OF THE INVENTION

In conventional semiconductor light emitting devices, a light extraction surface is subjected to surface roughening to increase light emission intensity. However, it is practically difficult to apply such surface roughening to a miniaturized semiconductor light emitting device, and it used to be difficult to achieve miniaturization and higher brightness.

The present invention has been made in view of such conventional problems, and it is an object thereof to provide a semiconductor light emitting device that achieves miniaturization and higher brightness, and a method of manufacturing the same.

The present embodiment is a semiconductor light emitting device having a light extraction surface parallel to a lamination direction of a semiconductor layer being a laminated body. The device includes: a light guide member placed on the semiconductor layer and having a first sloped surface that is a side surface opposite to the light extraction surface and sloped to the light extraction surface; a light-reflecting member placed on a surface of the light guide member including at least the first sloped surface of the light guide member; and a light-reflecting package opening a side of the light extraction surface, and covering a side surface of the semiconductor layer and the light guide member.

In addition, the present embodiment is a method of manufacturing a semiconductor light emitting device having a light extraction surface parallel to a lamination direction of a semiconductor layer being a laminated body. The method includes: placing a plurality of light emitting elements having a semiconductor layer on a support; molding a light guide member linking between adjacent two light emitting elements facing a side to be the light extraction surface and having sloped surfaces sloped to each other at both ends in a direction of the linking; placing a light-reflecting member on a surface of the light guide member including at least the sloped surfaces of the light guide member; placing an insulating member to cover a side surface of the semiconductor layer and the light guide member; and forming a package side surface including the light extraction surface by cutting the insulating member and the light guide member at a position between the adjacent two light emitting elements, and also forming a package side surface other than the side surface including the light extraction surface by cutting the insulating member surrounding the light emitting elements.

In addition, the present embodiment is a method of manufacturing a semiconductor light emitting device having a light extraction surface parallel to a lamination direction of a semiconductor layer being a laminated body. The method includes: forming a plurality of light emitting elements by laminating a semiconductor layer on a growth substrate having translucency; forming sloped surfaces sloped to each other at both ends in a direction of linking between adjacent two light emitting elements facing a side to be the light extraction surface on the growth substrate; placing a light-reflecting member on a surface of the growth substrate including at least the sloped surfaces of the growth substrate; placing an insulating member to cover a side surface of the semiconductor layer and the growth substrate; and forming a package side surface including the light extraction surface by cutting the insulating member and the growth substrate at a position between the adjacent two light emitting elements and also forming a package side surface other than the side surface including the light extraction surface by cutting the insulating member surrounding the light emitting elements.

According to the present embodiment, it is possible to reduce light leakage to surfaces other than a light extraction surface of a semiconductor light emitting device, that is, to reduce loss of light emission and to achieve higher brightness.

DESCRIPTION OF THE PREFERRED EMBODIMENTS

Figure 1:
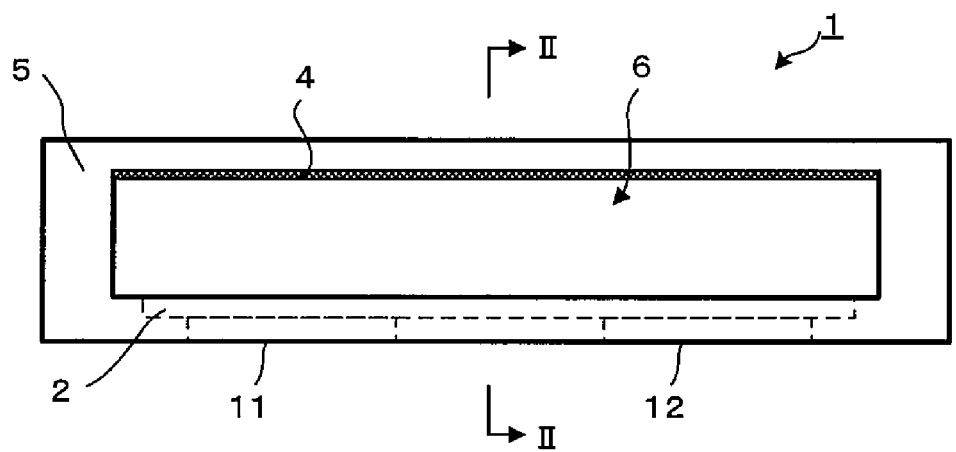
FIG. 1 is a front view of a semiconductor light emitting device of one embodiment of the present invention, and the view is from the side of a light extraction surface.

A semiconductor light emitting device according to preferred embodiments of the present invention is described below with reference to the drawings. Throughout each referred drawing, an identical reference numeral is given to each identical component and a corresponding component although in a different embodiment. The configurations in these drawings are merely exemplification to illustrate the semiconductor light emitting device of the present invention. The drawings are schematic views exaggeratingly illustrating the configuration of the semiconductor light emitting device. The present invention is not limited to these drawings and the descriptions in the embodiments.

Figure 2:
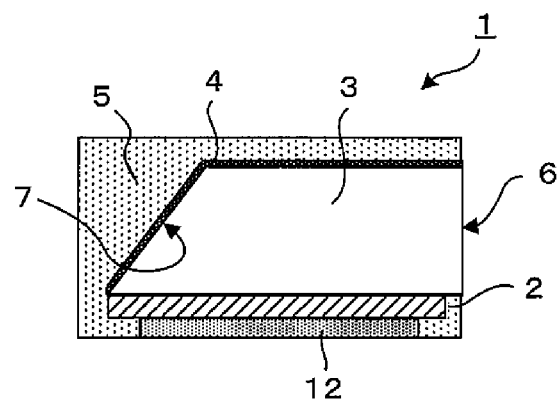
FIG. 2 is a longitudinal cross sectional view of the semiconductor light emitting device illustrated in FIG. 1.

FIG. 1 is a front view of a semiconductor light emitting device 1 of one embodiment of the present invention and the view is from the side of a light extraction surface. FIG. 2 is a diagram schematically illustrating a longitudinal cross section of the semiconductor light emitting device 1 when being cut at a II-II position illustrated in FIG. 1.

The semiconductor light emitting device 1 is provided with a semiconductor layer 2, being a laminated body that configures an LED, and a light extraction surface 6 to extract light radiated from the semiconductor layer 2 to outside. The light extraction surface 6 is parallel to a lamination direction of the semiconductor layer 2. The light extraction surface 6 does not have to be strictly parallel to the lamination direction of the semiconductor layer 2 and may be approximately parallel, that is, substantially parallel. As long as the light extraction surface 6 is parallel to at least a lamination direction of an active layer, which is an intermediate layer of the semiconductor layer 2, it may be regarded as being parallel or substantially parallel to the lamination direction of the semiconductor layer 2. Here, a semiconductor light emitting layer is the active layer that is the semiconductor layer 2 of the LED or an intermediate layer thereof.

For the semiconductor layer 2, it is possible to use, for example, a GaN based LED of a nitride based compound semiconductor (general formula to be $In_xAl_yGa_{1-x-y}N$ ($0 \le x$, $0 \le y$, $x+y \le 1$)). Such GaN based LED may include an ultraviolet LED, a blue LED, and a green LED, and the like. The semiconductor layer 2 that configures the LED may also be of a semiconductor of another compound, such as a ZnSe based compound, an InGaAs based compound, and AlInGaP based compound, for example. Using them appropriately, it is possible that the wavelength range of emission colors of the LED covers from ultraviolet light to the entire range of visible light. Beneath the semiconductor layer 2, an n-electrode 11 and a p-electrode 12 are formed.

The semiconductor light emitting device 1 in the present embodiment is provided with a light guide member 3 placed on the semiconductor layer 2 and having translucency, a light-reflecting member 4 placed on a surface of the light guide member 3, and a package 5 of an insulating member having an opening on the side of the light extraction surface 6 and placed so as to cover the semiconductor layer 2, side surfaces (only a side surface at the left end is illustrated in FIG. 2) of the semiconductor layer 2, and the light guide member 3 therein. The package 5 may also have a structure of covering the side surfaces of the semiconductor layer 2 and an upper surface of the light-reflecting member 4. The package 5 may also have a structure of covering side surfaces adjacent to a first sloped surface of the light guide member 3.

The light guide member 3 has translucency. The light guide member 3 may be a wavelength conversion section containing, for example, a phosphor as a wavelength conversion material.

The wavelength conversion material (phosphor) may contain a nitride based phosphor or an oxynitride based phosphor that is activated by, for example, a lanthanoid based element, such as Ce and Eu. More specifically, as the phosphor, it is possible to use rare earth aluminate that is activated by, for example, a lanthanoid element, such as Ce. Among them, as the phosphor, a YAG based phosphor is used preferably. The phosphor may also be those having all or part of Y in the YAG based phosphor replaced with Tb and/or Lu. It is also possible to use rare earth silicate that is activated by Ce and the like for the material of the phosphor.

As the wavelength conversion material (phosphor), it is also possible to use alkaline earth halogen apatite, alkaline earth metal halogen borate, alkaline earth metal aluminate, alkaline earth metal sulfide, alkaline earth metal thiogallate sulfide, or alkaline earth metal silicon nitride or germanate that is activated by a lanthanoid based element, such as Eu, or an organic material or an organic complex that is activated by a lanthanoid based element, such as Eu. For example, as a red phosphor, there are a SCASN based phosphor, such as $(Sr, Ca)AlSiN_3$:Eu, a CASN based phosphor, such as $CaAlSiN_3$:Eu, $SrAlSiN_3$:Eu, and the like. In addition to them, for the material, it is possible to use, for example, a chlorosilicate phosphor, a β-sialon phosphor, and the like that absorb blue light of a light emitting element and emit green light. Still in addition, it is also possible to use at least one selected from the group consisting of a $Mn^{4+}$ activated Mg fluorogermanate phosphor, and a $M^1_2M^2F_6$:$Mn^{4+}$ ($M^1$=Li, Na, K, Rb, Cs; $M^2$=Si, Ge, Sn, Ti, Zr) phosphor.

The light guide member 3 may also encapsulate the semiconductor layer 2. It is preferred that such encapsulant is a transparent resin containing a phosphor (wavelength conversion material). The encapsulant does not have to contain a phosphor (wavelength conversion material) and may also be a resin containing a diffusing agent (filler and the like) and a colorant (pigment and the like).

The light guide member 3 may also be of a growth substrate of sapphire and the like of the semiconductor layer 2. The light guide member 3 may still also be a transparent glass substrate. The light guide member 3 may have a single layer structure while it may also have a multilayer structure in which a wavelength conversion section to convert a wavelength of light radiated from the semiconductor layer 2 and a transparent section are laminated. For example, the light guide member 3 may also be one having, for example, a YAG based phosphor layer formed on a surface of a growth substrate of sapphire and the like.

Figure 3:
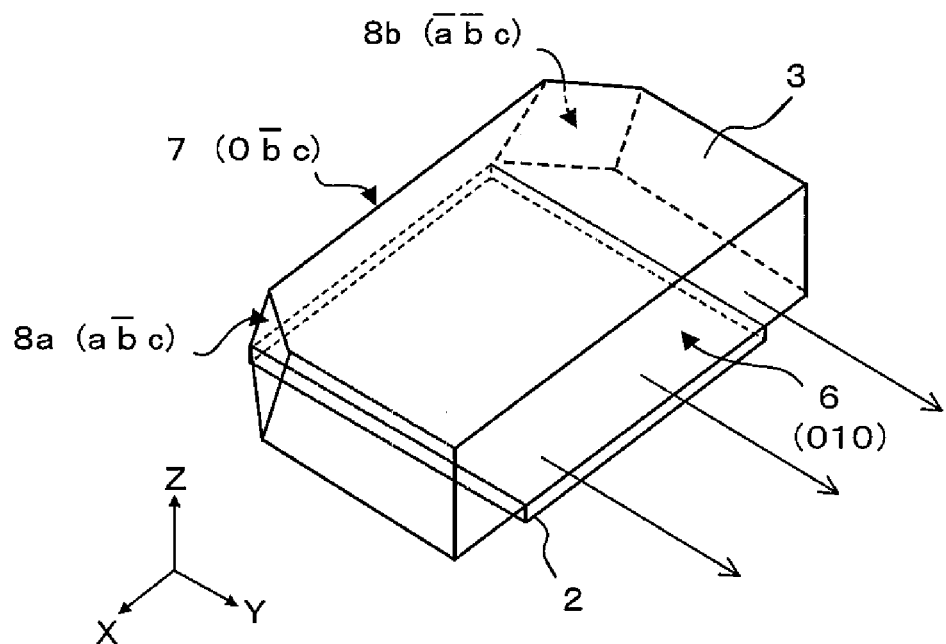
FIG. 3 is a perspective view of a light guide member, to be placed on the semiconductor layer, in an embodiment of the present invention.
Figure 4:
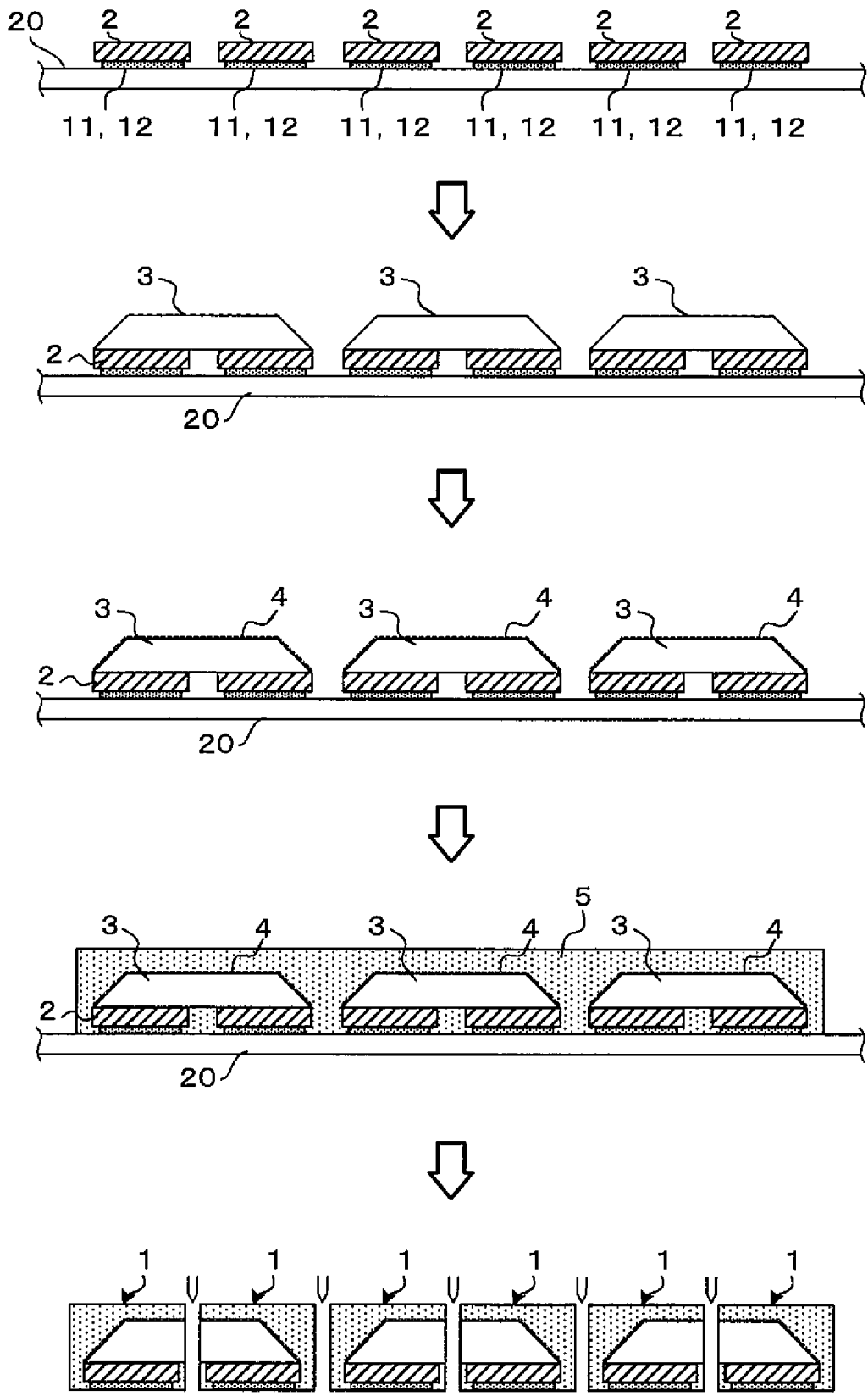
FIG. 4 is a flow diagram illustrating steps in cross section to illustrate a method of manufacturing a semiconductor light emitting device of an embodiment of the present invention.

Here, a perspective view in FIG. 3 exemplifies the shapes of the semiconductor layer 2 and the light guide member 3 to be placed on the semiconductor layer 2. The light guide member 3 illustrated in the drawing has a first sloped surface 7 that is a side surface opposite to the light extraction surface 6 and sloped to the light extraction surface 6.

For example, when a light emitting surface of the semiconductor layer 2 is represented by a surface (001) and the light extraction surface 6 orthogonal to the light emitting surface is represented by a surface (010), the first sloped surface 7 is formed on a surface (0-bc). Here, the Miller indices b and c are arbitrary positive integers. In the description of surface orientation herein, when the Miller index has a negative component, a minus sign "−" is put in front of the number for the convenience.

The first sloped surface 7 may be, for example, a surface (0-11) that is sloped at 45 degrees to the light extraction surface 6. The sloped surface 7 may also be in a surface orientation making an angle in a range, for example, from the surface (0-11) to a surface (0-21).

In the light guide member 3 illustrated in FIG. 3, second and third sloped surfaces 8a and 8b sloped to the light extraction surface 6 are formed at both corners of the first sloped surface 7 in the longitudinal direction. According to the embodiment in FIG. 3, when the light extraction surface 6 is represented by the surface (010), the second sloped surface 8a is formed on a surface (a-bc) and the third sloped surface 8b is formed on a surface (−a-bc). Here, the Miller indices a, b, and c are arbitrary positive integers. For example, the second sloped surface 8a may be a surface (1-11) and the third sloped surface 8b may be a surface (−1-11). The second sloped surface 8a may also be in a surface orientation making an angle in a range of the surfaces from (1-11) to (2-21). Similarly, the third sloped surface 8b may also be in a surface orientation making an angle in a range of the surfaces from (−1-11) to (−2-21). It should be noted that the second and third sloped surfaces 8a and 8b are preferably in relationship of plane symmetry. It is also preferred to form the light guide member 3 not to create a level difference at a boundary between the first and second sloped surfaces 7 and 8a. Similarly, it is preferred to form the light guide member 3 not to create a level difference at a boundary between the first and third sloped surfaces 7 and 8b.

The light guide member 3 described above may be placed by being directly joined to the semiconductor layer 2 and may also be placed to the semiconductor layer 2 via a certain type of medium layer, such as a transparent adhesive. The light guide member 3 may further be placed on a growth substrate of sapphire and the like.

Here, "being directly joined" is to join interfaces utilizing bonding of atoms without interposing an adhesive and the like. Here, direct joining to be used is preferably a method of joining that is generally classified into room temperature bonding. Although there is a method of promoting a chemical reaction and diffusion at a very high temperature for joining among the direct joining, such high temperature method is not preferred from the restrictions of temperature in LEDs.

The direct joining method suitable for the present embodiment may include surface activation bonding, atom diffusion bonding, and hydroxyl group bonding. In the surface activation bonding, inert ions are irradiated to a bonding interface in extreme high vacuum, thereby cleaning and activating the surfaces for joining. In the atom diffusion bonding, metal is sputtered similarly in extreme high vacuum for joining by the metal diffusion. It is also confirmed that it is possible to bond without affecting the light extraction by making a sputtering film very thin. In the hydroxyl group bonding, hydroxyl groups are formed in a bonding interface for joining by hydrogen bonding of the hydroxyl groups. In the room temperature bonding, there is the case of increasing the bonding strength by carrying out heat treatment as needed. In that case, the heating may be carried out at 400° C. or less, preferably 300° C. or less, and more preferably 200° C. or less. As another suitable direct joining method, there is an anode joining method that carries out low temperature bonding in an electric field.

By employing such direct joining, it is possible to ignore the influence to optical properties of the light radiated to the joined member, which is the light guide member 3.

Although not shown, the light guide member 3 may also have the wavelength conversion section and/or the transparent section placed to the semiconductor layer 2 via a band pass filter (BPF). In the case of the nitride based compound semiconductor having a wavelength peak at around 450 nm, the wavelength band of the BPF is preferably from 420 to 500 nm. The wavelength band of the BPF is more preferably from 430 to 470 nm.

In the semiconductor light emitting device 1 of the present embodiment, the light-reflecting member 4 is placed on a surface of the light guide member 3 including at least the sloped surfaces 7, 8a, and 8b of the light guide member 3.

The light-reflecting member 4 illustrated in FIGS. 1 and 2 is, for example, a distributed bragg reflector (DBR) formed on a surface of the light guide member 3. The DBR is also referred to as a "dielectric DBR mirror" and is a laminated film having a λ/2n period of two layers of a high refractive index layer and a low refractive index layer (here, X denotes a wavelength of LED light in vacuum, n denotes a refractive index of a medium (specifically, the light guide member)). The DBR may be a laminated film of, for example, $SiO_2$ as the low refractive index layer and $Nb_2O_5$ or $TiO_2$ as the high refractive index layer. The number of lamination may be approximately from three to five pairs in the case of a single layer of λ/4n layer. The light-reflecting member 4, which is the DBR, has a function of reflecting the light radiated from the semiconductor layer 2. The light radiated from the semiconductor layer 2 thus passes through the light guide member 3 reflects at the boundary between the light guide member 3 having the sloped surfaces 7, 8a, and 8b and the light-reflecting member 4 to be efficiently guided to the light extraction surface 6.

The light-reflecting member 4 may also be light-reflecting or lustrous metal, such as Ag and Al. The light-reflecting member 4 may further be a multilayer body of a metal layer and a DBR layer. Since the metal turns out to absorb a part of the light of the light emitting element, the light-reflecting member 4 is preferably DBR. Although the DBR is capable of reflecting majority of the light from the light emitting element, a part of the light leaks due to the Brewster angle. In order to improve the brightness of the light emitting device by inhibiting the leakage light, it is preferred that the sloped surfaces and the side surfaces of the semiconductor layer are covered with the package 5 described later from above the DBR. The light-reflecting member 4 may also be provided with a laminated body in which the DBR and the metal are laminated from the side of the semiconductor layer 2 in order.

The semiconductor light emitting device 1 in the present embodiment is provided with the package 5 having an opening on the side of the light extraction surface 6 and placed so as to cover the semiconductor layer 2 and the light guide member 3 therein. The package 5 is electrically insulating and light-reflecting with white color. As illustrated in FIG. 2, the light-reflecting package 5 covers side surfaces adjacent to the first sloped surface 7 of the light guide member 3. Although not shown, the light-reflecting package 5 may also cover side surfaces adjacent to the second and third sloped surfaces 8a and 8b of the light guide member 3. The light-reflecting package 5 continuously covers from the side surfaces of the semiconductor layer 2 to a bottom face of the semiconductor layer 2, which is an opposite side of the side on which the light guide member 3 of the semiconductor layer 2 is placed. By such light-reflecting package 5, it is possible to inhibit the light leakage. Electrodes 11 and 12 are provided on the side of the bottom face of the semiconductor layer 2, and it is preferred that the light-reflecting package 5 continuously covers a part of the electrodes 11 and 12 and the bottom face of the semiconductor layer 2. In such a manner, the light-reflecting package 5 continuously covers to the bottom face of the semiconductor layer 2, thereby not only enabling inhibition of light leakage but also sufficiently securing electrical insulation between the electrodes 11 and 12 having different polarity.

A material of the package 5 illustrated in FIGS. 1 and 2 is preferably an insulating member including a resin, such as a silicone resin and an epoxy resin, for example. It is preferred that these resins contain one of oxide selected from the group consisting of Ti, Zr, Nb, Al, and Si or at least one of AlN and MgF in order to make white color having light reflectivity. It is particularly preferred to mix at least one selected from the group consisting of $TiO_2$, $ZrO_2$, $Nb_2O_5$, $Al_2O_3$, MgF, AlN, and $SiO_2$. By employing such materials, it is possible that the package 5 is provided with preferred electrical insulation, mechanical strength, and light reflectivity.

For the material of the package 5, a thermoplastic resin capable of transfer molding, other than the resins described above, may also be used.

The package 5 provided both with such light reflectivity and electrical insulation is integral with an insulating member that electrically insulates between the n-electrode 11 and the p-electrode 12 connecting to the semiconductor layer 2. The structure of the semiconductor light emitting device 1 is thus simplified and it is possible to reduce the number of manufacturing steps.

The semiconductor light emitting device 1 in the present embodiment has a package size of, for example, 2 mm×1 mm and has a height (thickness) of 0.3 mm. It should be noted that the package size is not limited for carrying out the present invention.

Next, a description is given to a method of manufacturing the semiconductor light emitting device in the embodiment described above with reference to FIGS. 4 and 5(a) through 5(d).

Firstly, a plurality of LED elements (hereinafter, referred to as "light emitting elements"), being laminated bodies having the semiconductor layers 2, the n-electrodes 11, the p-electrodes 12, predetermined protective film layers, and the like formed therein, are prepared. For the semiconductor layer 2, it is possible to use a GaN based material of a nitride based compound semiconductor (general formula to be $In_xAl_yGa_{1-x-y}N$ ($0 \leq x$, $0 \leq y$, $x+y \leq 1$)). The n-type semiconductor layer of the semiconductor layer 2 has a GaN layer containing Si, and the p-type semiconductor layer has a GaN layer containing Mg or Zn. The active layer has a GaN layer and a GaN layer. Although not shown, the active layer has a quantum well structure.

It is possible to form the semiconductor layer 2 by sequential lamination on a growth substrate of sapphire and the like by, for example, metal organic chemical vapor deposition, MOCVD. The semiconductor layer 2 may also be formed using another gas phase growth method or liquid phase epitaxy.

The n-electrode 11 as a cathode is provided by being electrically joined to the n-type semiconductor layer. In contrast, the p-electrode 12 as an anode is provided by being electrically joined to the p-type semiconductor layer. For example, under barrier metal (UBM) is formed at respective predetermined positions of the n-type semiconductor layer and the p-type semiconductor layer by sputtering and the like, and conductive metal having good wettability (for example, Au), is plated on the formed UBM, thereby obtaining the n-electrode 11 and the p-electrode 12 with a bump shape.

Figure 5A:
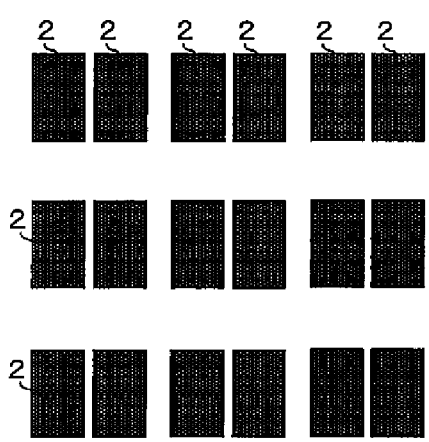
FIGS. 5(a) through 5(d) are plan views illustrating steps of manufacturing a semiconductor light emitting device corresponding to FIG. 4.

After removing the sapphire growth substrate from the light emitting elements by laser lift off method (LLO method) (not shown), the light emitting elements are installed so as to have the n-electrode 11 and the p-electrode 12 in contact on, for example, an adhesive sheet 20, which is a support. The light emitting elements may also be installed on the adhesive sheet 20 with the growth substrate remained. The growth substrate may be lifted off after the light emitting elements are installed on the adhesive sheet 20, or the growth substrate may also be remained still on the semiconductor layer 2. Here, FIG. 5(a) illustrates a plan view after the step of placing a plurality of semiconductor layers 2 (light emitting elements) at a predetermined interval in a matrix.

Figure 5B:
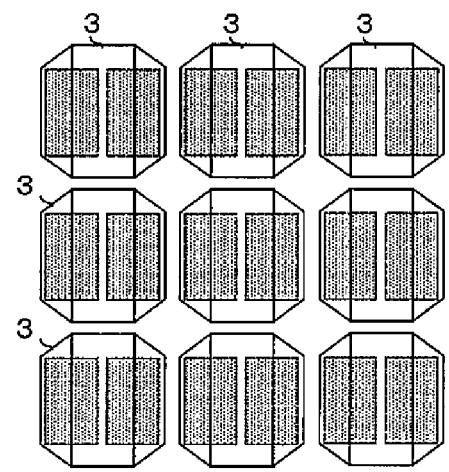

After placing the light emitting elements in a matrix, a plurality of light guide members 3 are respectively placed apart at an interval for each of the adjacent two light emitting elements. FIGS. 4 and 5(a) through 5(d) illustrate an example of placing the light guide members 3 to link between the adjacent two light emitting elements facing each other on the sides to be the light extraction surfaces. The light guide members 3 are a transparent resin containing, for example, a YAG based phosphor. The light guide members 3 are molded in a predetermined shape having sloped surfaces sloped to each other at both ends in a direction of linking between the two light emitting elements. To the light emitting elements with a growth substrate remained, a wavelength conversion member may also be molded on the growth substrate. Here, FIG. 5(b) illustrates the semiconductor layers 2 placed in a matrix and the light guide members 3 after the step of being placed on them and molded in a predetermined shape. In this exemplification, the plurality of light guide members 3 extending in the depth direction of the drawing are placed at a predetermined interval.

The light guide members 3 may also have the transparent resin containing, in addition to the phosphor (wavelength conversion material), a diffusing agent (filler and the like) and/or a colorant (pigment and the like), for example. In addition, the BPF may directly join to the semiconductor layer 2, and then a wavelength conversion member containing a phosphor may be molded to place the light guide member 3.

Next, the light-reflecting member 4 is placed on a surface of the light guide member 3 including at least the sloped surfaces of the light guide member 3. The light-reflecting member 4 is a DBR formed on a surface of the light guide member 3. The light-reflecting member 4 may also be formed by sputtering light-reflecting or lustrous metal, such as Ag and Al, on a surface of the light guide member 3. The light-reflecting member 4 may further be provided with a laminated body laminated the DBR and metal in this order from the side of the semiconductor layer 2.

Figure 5C:
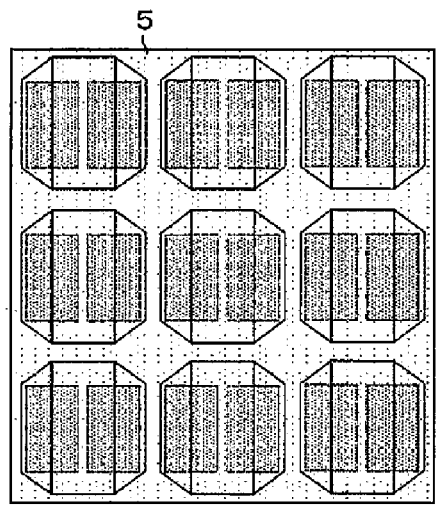
Figure 5D:
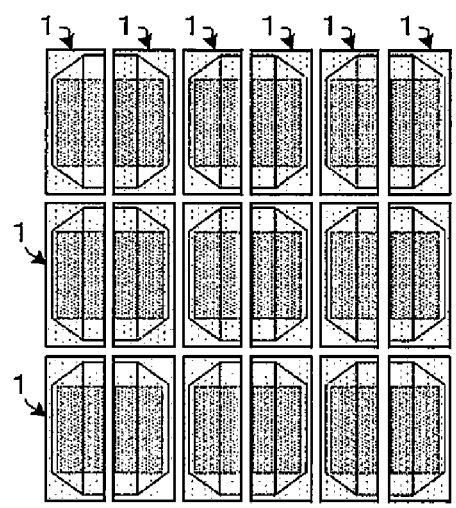

Next, an insulating member, which is a material of the package 5, is placed to cover all side surfaces of the semiconductor layers 2 and the light guide members 3 on which the light-reflecting members 4 are placed. The package 5 is molded by pouring a thermosetting resin, such as a silicone resin and an epoxy resin, obtained by mixing the thermosetting resin with an oxide of one selected from the group consisting of Ti, Zr, Nb, Al, and Si or at least one of AlN and MgF into a mold, and for heating it. Particularly, as a material of the package 5, it is preferred to contain at least one selected from the group consisting of $TiO_2$, $ZrO_2$, $Nb_2O_5$, $Al_2O_3$, MgF, AlN, and $SiO_2$. It is thus possible that the package 5 obtains good electrical insulation and light reflectivity. FIG. 5(c) illustrates a plan view after the step of filling the insulating member, which is a material of the package 5 to cover each light guide member 3.

The insulating member to be the package 5 is filled to plug a gap of the light emitting elements and also to cover the side surfaces adjacent to the first sloped surfaces of the light guide members 3. The insulating member of the package 5 is continuously filled on the side surfaces of the semiconductor layer 2 and the bottom face of the semiconductor layer 2 provided with the electrodes 11 and 12. The insulating member is filled to each gap of the electrodes 11 and 12, thereby securing sufficient electrical insulation between these electrodes.

For a method of molding the package 5, a general molding method, such as compression molding, transfer molding, and injection molding, may be employed. After curing the resin by heating, external pad electrodes that are electrically connected to the electrodes 11 and 12 may also be formed optionally.

As the material of the package 5, a thermoplastic resin that is capable of transfer molding may also be used other than the resins described above.

Then, the insulating member to be the package 5 and the light guide members 3 are cut at positions between the adjacent two light emitting elements. Thus, a side surface of the package 5 including the light extraction surface 6 is formed and also the insulating member surrounding the light emitting elements is cut to form the side surface of the package 5 other than the side surface including the light extraction surface 6. For a method of cutting them, dicing or diamond cutting, for example, is used. Through such manufacturing steps, the semiconductor light emitting device 1 of end surface emitting type achieving miniaturization and high brightness is provided. FIG. 5(*d*) illustrates a plan view of a plurality of semiconductor light emitting devices 1 obtained after the step of cutting.

Figure 6:
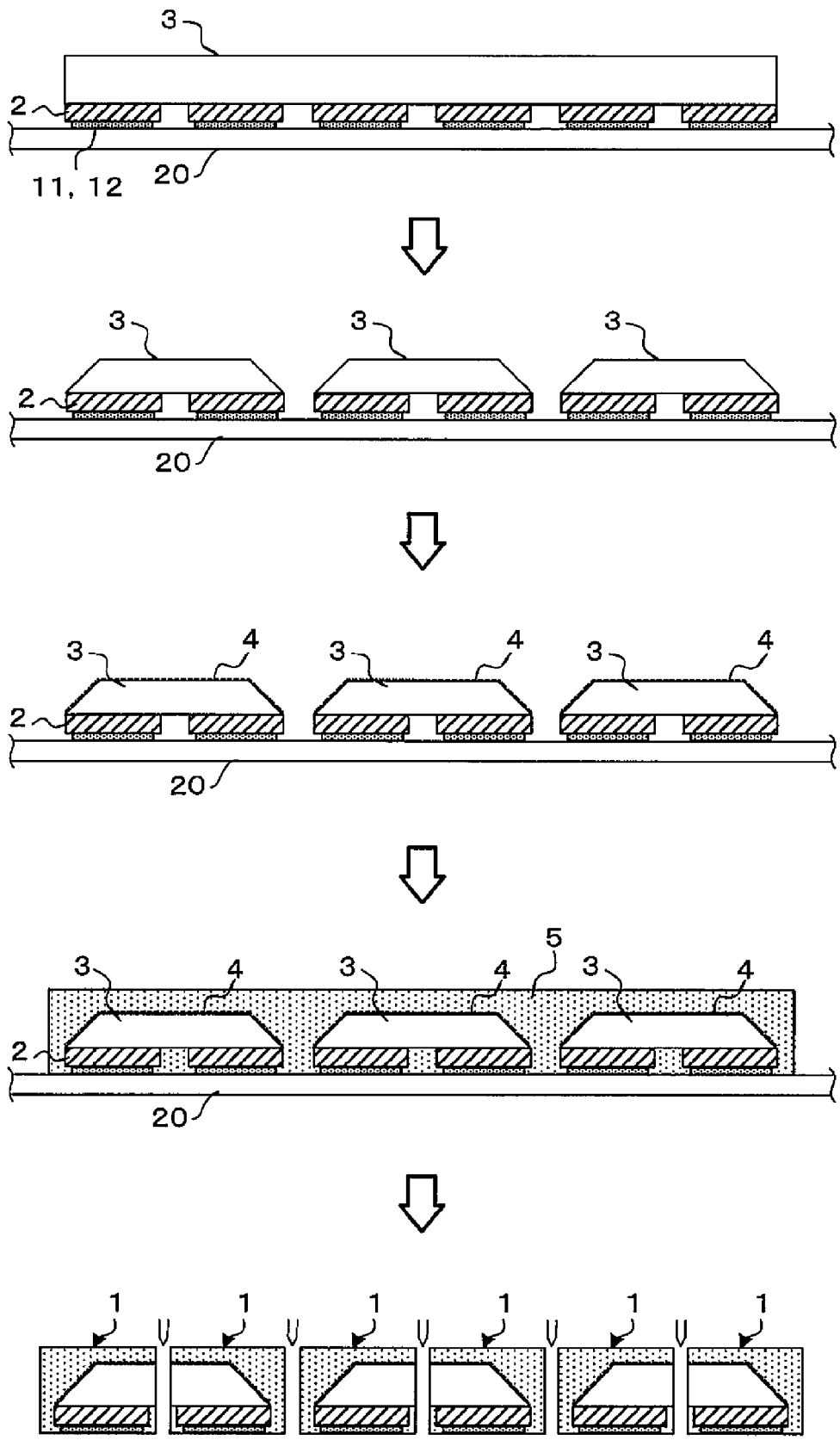
FIG. 6 is a diagram to illustrate a method of manufacturing a semiconductor light emitting device of another embodiment of the present invention.

With reference to FIG. 6, a description is given to another method of manufacturing a semiconductor light emitting device. Firstly, a plurality of light emitting elements, being laminated bodies having the semiconductor layers 2, the n-electrodes 11, the p-electrodes 12, predetermined protective film layers, and the like formed therein, are prepared. For the semiconductor layer 2, it is possible to use a GaN based material of a nitride based compound semiconductor (general formula to be $In_xAl_yGa_{1-x-y}N$ ($0 \leq x$, $0 \leq y$, $x+y \leq 1$)). The n-type semiconductor layer of the semiconductor layer 2 has a GaN layer containing Si, and the p-type semiconductor layer has a GaN layer containing Mg or Zn. The active layer has a GaN layer and a GaN layer.

It is possible to form the semiconductor layer 2 by sequential lamination on a growth substrate of sapphire and the like by, for example, MOCVD. The semiconductor layer 2 may also be formed using another gas phase growth method or liquid phase epitaxy.

The n-electrode 11 as a cathode is provided by being electrically joined to the n-type semiconductor layer. In contrast, the p-electrode 12 as an anode is provided by being electrically joined to the p-type semiconductor layer. For example, under barrier metal (UBM) is formed at respective predetermined positions of the n-type semiconductor layer and the p-type semiconductor layer by sputtering and the like, and conductive metal having good wettability (for example, Au), is plated on the formed UBM, thereby obtaining the n-electrode 11 and the p-electrode 12 with a bump shape.

The light emitting elements are installed so as to have the n-electrode 11 and the p-electrode 12 in contact on, for example, an adhesive sheet 20, which is a support. After placing the light emitting elements in a matrix, sloped surfaces are formed for each of the adjacent two light emitting elements, so as to locate the plurality of growth substrates to be the light guide members 3 respectively located apart at an interval. FIG. 6 illustrates an example of forming sloped surfaces that are sloped to the growth substrates to be the light guide members 3. The sloped surfaces illustrated in FIG. 6 are sloped surfaces that are sloped to each other at both ends of the light guide members 3 in a direction of linking between the two light emitting elements facing each other on the sides to be the light extraction surfaces.

The growth substrates may also be removed from the semiconductor layer 2 by LLO method and then the light guide members 3 of transparent glass substrates may also be directly joined to the semiconductor layers 2. In that case, after placing the glass substrates on the semiconductor layers 2, the glass substrates may also be shaped in a predetermined shape. In addition, glass substrates shaped in a predetermined shape in advance may also be directly joined on the semiconductor layers 2.

The light guide member 3 may also have, for example, a transparent section of a glass substrate and a wavelength conversion section containing a phosphor laminated or formed on the transparent section. The transparent section and/or the wavelength conversion section may also be joined to the semiconductor layer 2 via the BPF.

In order to shape the light guide member 3 of a growth substrate or a glass substrate in a predetermined shape having sloped surfaces, appropriate and optional machining, such as dicing, diamond cutting, and laser machining, for example, may be used. In addition, when the light guide member 3 is of a monocrystalline substrate of sapphire and the like, the sloped surfaces may be formed by anisotropic etching.

Next, the light-reflecting members 4 are placed on the surface of the light guide members 3 including at least the sloped surfaces of the light guide members 3. The light-reflecting member 4 is a DBR formed on a surface of the light guide member 3. The light-reflecting member 4 may also be formed by sputtering light-reflecting or lustrous metal, such as Ag and Al, on a surface of the light guide member 3. The light-reflecting member 4 may further be provided with a laminated body laminated the DBR and metal in this order from the side of the semiconductor layer 2. It is possible to form such light-reflecting members 4 on the surfaces of the light guide members 3 more easily by formation on the sloped surfaces of the light guide members 3 compared to forming on vertical faces of the light guide members 3.

Next, an insulating member, which is a material of the package 5, is placed to cover all side surfaces of the semiconductor layers 2 and the light guide members 3 on which the light-reflecting members 4 are placed. The method of molding the package 5 and the insulating material are as described above.

The insulating member to be the package 5 is filled to plug a gap of the light emitting elements and is filled to gaps of each of the electrodes 11 and 12 to insulate each of the electrodes 11 and 12.

For a method of molding the package 5, a general molding method, such as compression molding, transfer molding, and injection molding, may be employed. After curing the resin by heating, external pad electrodes that are electrically connected to the electrodes 11 and 12 may also be formed optionally.

As the material of the package 5, a thermoplastic resin that is capable of transfer molding may also be used other than the resins described above.

Then, the insulating member to be the package 5 and the light guide members 3 (growth substrates or glass substrates) are cut at positions between the adjacent two light emitting elements. Thus, a side surface of the package 5 including the light extraction surface 6 is formed and also the insulating member surrounding the light emitting elements is cut to form the side surface of the package 5 other than the side surface including the light extraction surface 6. For a method of cutting them, dicing or diamond cutting, for example, is used. Through such manufacturing steps, the semiconductor light emitting device 1 of end surface emitting type achieving miniaturization and high brightness is provided.

Figure 7:
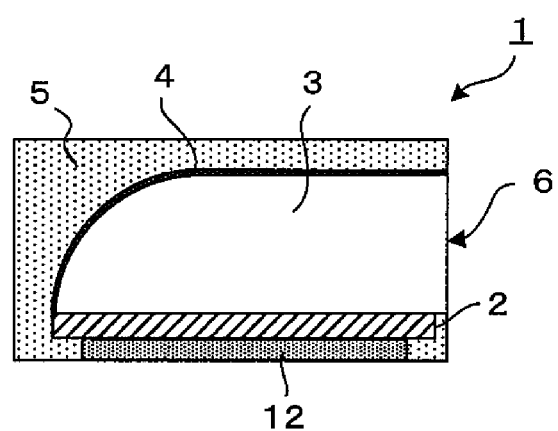
FIG. 7 is a longitudinal cross sectional view of a semiconductor light emitting device of another embodiment of the present invention.

In addition, as illustrated in the cross section of FIG. 7, the semiconductor light emitting device 1 according to the present embodiment may also be provided with the light guide member 3 having a curved surface on the side opposite to the light extraction surface 6. In addition, although not shown, in the light guide member 3 having a curved surface on the side opposite to the light extraction surface 6, spherical surfaces may also be formed at both corners in a longitudinal direction of the curved surface.

According to the semiconductor light emitting device in the embodiments described above, the light radiated from the semiconductor layer 2 passes through the light guide member 3 and is reflected on the light-reflecting member 4, so that it is efficiently guided to the light extraction surface 6 without leakage from the light guide member 3. Particularly, since the light guide member 3 has the sloped surfaces 7, 8a, and 8b, thereby shortening a distance from the light emitting surface of the semiconductor layer 2 to the light-reflecting member 4, the light extracted from the light extraction surface 6 can be obtained with reduced attenuation of the light inside the light guide member 3. The light is reflected on the second and third sloped surfaces 8a and 8b formed on the light guide member 3, thereby enabling reduction of loss of the light due to the attenuation and also reduction of light leakage inside the package 5, particularly from a corner of the light guide member 3.

Accordingly, the semiconductor light emitting device in the present embodiment is capable of reducing loss of light emission considerably more than the past. Even when the height of the package (in other words, thickness of the main body) is restricted for miniaturization of the semiconductor light emitting device, it is possible to increase the light emission intensity by enlarging the area of the light emitting layer in the depth direction and moreover it is also possible to reduce attenuation and leakage of the light. Accordingly, it is possible to achieve miniaturization and high brightness in the semiconductor light emitting device of end surface emitting type.

The present invention is not limited to the specific embodiments described above. Those skilled in the art may appropriately modify non-essential elements of these embodiments or substitute to other known elements within the scope of the technical ideas disclosed herein.

The invention claimed is:

1. A method of manufacturing a semiconductor light emitting device having a light extraction surface parallel to a lamination direction of a semiconductor layer being a laminated body, the method comprising:
    placing a plurality of light emitting elements having a semiconductor layer on a support;
    molding a light guide member linking between adjacent two light emitting elements facing a side to be the light extraction surface and having sloped surfaces sloped to each other at both ends in a direction of the linking;
    placing a light-reflecting member on a surface of the light guide member including at least the sloped surfaces of the light guide member;
    placing an insulating member to cover a side surface of the semiconductor layer and the light guide member; and
    forming a package side surface including the light extraction surface by cutting the insulating member and the light guide member at a position between the adjacent two light emitting elements, and also forming a package side surface other than the side surface including the light extraction surface by cutting the insulating member surrounding the light emitting elements.

2. The method of manufacturing a semiconductor light emitting device according to claim 1, wherein, after placing the light emitting elements in a matrix, a plurality of light guide members are placed respectively at an interval for each of the adjacent two light emitting elements.

3. A method of manufacturing a semiconductor light emitting device having a light extraction surface parallel to a lamination direction of a semiconductor layer being a laminated body, the method comprising:
    forming a plurality of light emitting elements by laminating a semiconductor layer on a growth substrate having translucency;
    forming sloped surfaces sloped to each other at both ends in a direction of linking between adjacent two light emitting elements facing a side to be the light extraction surface on the growth substrate;
    placing a light-reflecting member on a surface of the growth substrate including at least the sloped surfaces of the growth substrate;
    placing an insulating member to cover a side surface of the semiconductor layer and the growth substrate: and
    forming a package side surface including the light extraction surface by cutting the insulating member and the growth substrate at a position between the adjacent two light emitting elements, and also forming a package side surface other than the side surface including the light extraction surface by cutting the insulating member surrounding the light emitting elements.

4. The method of manufacturing a semiconductor light emitting device according to claim 3, wherein, after placing the light emitting elements in a matrix, the sloped surfaces are formed to the growth substrate to place a plurality of growth substrates respectively at an interval for each of the adjacent two light emitting elements.

* * * * *